United States Patent

Worcester

[15] 3,665,319

[45] May 23, 1972

[54] STATION DISENGAGEMENT AND SENSITIVITY CIRCUIT FOR SCAN TUNED RADIO RECEIVERS

[72] Inventor: Joseph A. Worcester, Frankfort, N.Y.

[73] Assignee: General Electric Company

[22] Filed: Dec. 29, 1970

[21] Appl. No.: 102,305

[52] U.S. Cl. ..............................325/470, 325/418, 325/453

[51] Int. Cl. ..........................................................H04b 1/32

[58] Field of Search .........................325/335, 418, 469, 470; 334/11, 16, 18, 26

[56] References Cited

UNITED STATES PATENTS

| | | | |
|---|---|---|---|
| 3,492,584 | 1/1970 | Takahashi | 325/335 X |
| 3,568,065 | 3/1971 | Pagany et al. | 325/470 X |
| 2,915,625 | 12/1959 | Worcester, Jr. | 325/469 |

*Primary Examiner*—Robert L. Griffin
*Assistant Examiner*—Richard K. Eckert, Jr.
*Attorney*—Marvin A. Goldenberg, W. J. Shanley, Jr., Frank L. Neuhauser, Oscar B. Waddell and Joseph B. Forman

[57] ABSTRACT

Upon scan initiation, a voltage is supplied to an amplifier of a scan tuned radio receiver to drive it into saturation and remove an input from the receiver's automatic frequency scan system, causing it to disengage from a previously tuned station. The source of said voltage also charges a control capacitor that, upon having the reference connection thereto reversed, selectively provides a voltage of opposite polarity to that originally supplied for reducing the sensitivity of the amplifier during the duration of the scan. Shortly after a station is encountered, full sensitivity is restored when the capacitor discharges.

8 Claims, 1 Drawing Figure

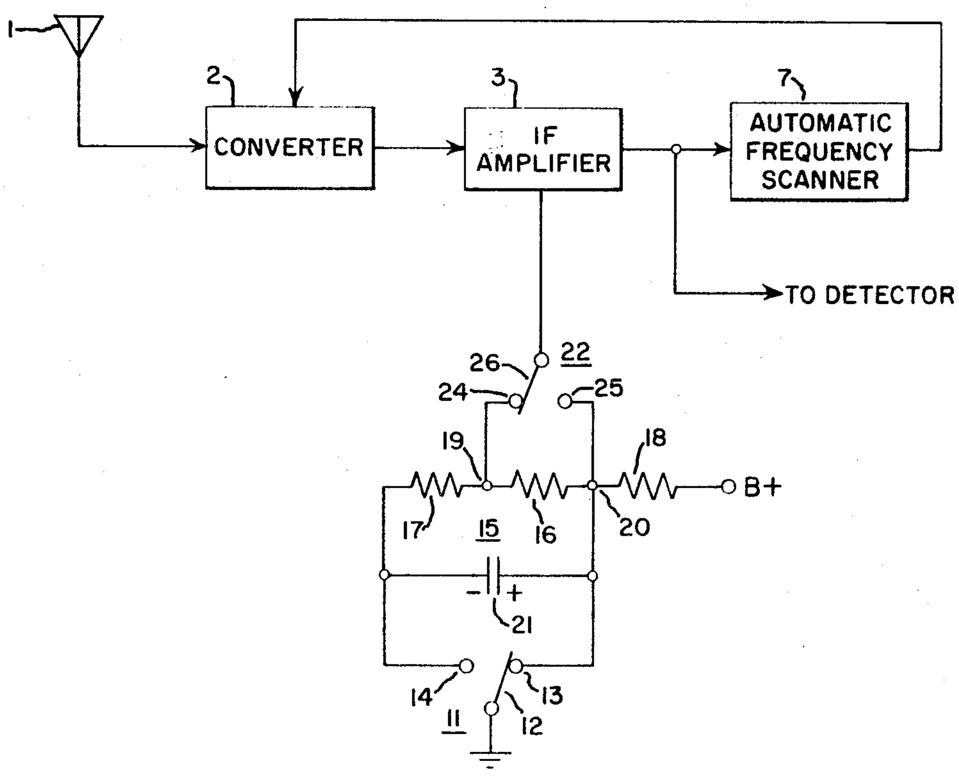
INVENTOR:
JOSEPH A. WORCESTER,
BY [signature]
HIS ATTORNEY.

STATION DISENGAGEMENT AND SENSITIVITY CIRCUIT FOR SCAN TUNED RADIO RECEIVERS

BACKGROUND OF THE INVENTION

This invention relates to a circuit for use in radio receivers having an automatic frequency scan tuning system, and more particularly to a compact circuit for use in such a receiver for disengaging the scan system from a previously tuned station, to enable a new scan to commence.

Radio receivers, in which reactance in the tuning circuitry are automatically varied to effect tuning of the receiver through a frequency spectrum until a station having a signal strength above a predetermined threshold level is encountered, are well known in the art. The variable reactance tuning means may be mechanical, such as a variable capacitor or inductor; or electronic, such as a varactor, whose reactance varies as a function of a bias voltage across it. Varactors are semiconductor diodes that are processed to have a variable junction capacitance when reverse biased.

In such radio receivers when a station having a signal strength above a predetermined level is encountered, threshold devices in the scan circuitry react to lock in the station. Should it be desired to scan toward a new station, it is necessary to first disengage the scan system from the previously locked-in station. Furthermore, in any given frequency spectrum, such as the broadcast band, there are stations having varying signal strengths, ranging from very weak to very strong. For example, local stations and sometimes very powerful distant stations generally have high signal strengths at the input to the receiver. At times it may be desired to tune only to such stations and it is bothersome to have the scan lock in every station encountered above the minimum threshold value. Thus, the weaker stations which are undesired by the operator may nonetheless have sufficient signal to be locked in. Every time one of these weaker stations is encountered, the scan must stop, requiring an effort to restart it.

At other times it may be desired to tune to all stations. For example, when there are no strong stations in the range of the receiver or if the operator wishes to tune to a weaker, probably more distant station, operation should permit the weaker stations to be received with clarity. Prior art circuitry does not readily provide a selective operation in accordance with the above requirements.

SUMMARY OF THE INVENTION

It is therefore an object of this invention to provide, in a radio receiver having automatic frequency scan tuning, an improved circuit for disengaging the scan tuning circuitry from a received signal thereby permitting a new scan to commence.

Another object of the invention is to provide an improved circuit for reducing the sensitivity of the receiver when it is desired to tune only to stations having high signal strengths at the receiver input.

A further object of this invention is to provide an improved circuit as above described, which selectively maintains maximum sensitivity when it is desired to include stations having low signal strengths in the scan.

Still another object of this invention is to provide an improved circuit as described, which is able to employ a single polarity power supply.

Briefly stated, the foregoing objects are attained in one embodiment of this invention by selectively controlling the sensitivity of the radio receiver. In the specific embodiment shown, a disabling voltage, e.g., of positive polarity, drives an amplifier that is forward of the scan tuning system into saturation, removing any amplifier output signal. There is then no output supplied to the scan tuning system for maintaining the station tuned in and the system is disengaged from the previously tuned station. The positive voltage also charges a storage device in the form of a control capacitor that after a brief lapse of time when it discharges, makes available an enabling voltage that can be connected to the amplifier by the actuation of a sensitivity switch. When the sensitivity switch is in a first position a first level enabling voltage, e.g., at the receiver reference potential, is applied to the input of the amplifier, insuring maximum sensitivity. When the sensitivity switch is in its second position, a second level enabling voltage, e.g., of negative polarity, is applied to the amplifier, decreasing the sensitivity of the amplifier. When the capacitor discharges completely after a station is tuned in, the negative voltage is removed from the amplifier and the reference voltage again applied, restoring full sensitivity to the amplifier.

BRIEF DESCRIPTION OF THE DRAWING

While the specification concludes with claims particularly pointing out and distinctly claiming the subject matter which is regarded as the invention, it is believed that the invention will be better understood from the following description taken in connection with the accompanying FIGURE of the drawing which is a schematic circuit diagram of the improved station disengagement and sensitivity control circuitry employed in carrying out the invention.

DESCRIPTION OF THE PREFERRED EMBODIMENT

Referring to the FIGURE of the drawing, an incoming radio signal is received by an antenna 1 of a radio receiver and coupled to a converter stage 2, where the radio frequency signal is tuned and converted down to an intermediate frequency signal by mixing with a local oscillator signal. The converter stage 2 may be a conventional autodyne converter component which includes tuning means, e.g., in the form of varactor diodes, for tuning the incoming and local oscillator signals over a predetermined band of frequencies. The stage 2 is coupled to an IF amplifier stage 3, the output of which is conventionally connected to the detector circuit of the receiver, not shown. The output of stage 3 is further connected to an automatic frequency scan circuit 7 of conventional form. The scan circuit 7 provides control signals to the converter stage 2 for scan tuning of the radio receiver and for stopping the scan in response to and for reception of received signals of selected signal strength.

A first switch 11 is arranged to be actuated to provide a scan initiation. The switch includes a movable contact arm 12 and first and second fixed contact positions 13 and 14. The arm 12 is biased into normal engagement with contact position 13 and is momentarily movable to engagement with the second contact position 14 for scan initiation.

In order to supply voltage levels for station disengagement a voltage divider or tapped impedance 15, comprised of serially connected resistors 16 and 17, is coupled through a biasing resistor 18 to a source of positive biasing voltage $B^+$. The tapped impedance 15, which includes terminals 19 and 20 between resistors 16 and 17 and 16 and 18, is connected across contact positions 13 and 14 so that when contact arm 12 is momentarily displaced to position 14, current flows through the resistors 16 and 17. To make available for subsequent use a voltage level for sensitivity control, a control capacitor 21 is connected across the tapped impedance 15 and the contact positions 13 and 14 of switch 11 so that when the switch is actuated, control capacitor 21 charges in a direction as shown in the FIGURE.

To provide for selection of the desired sensitivity by the operator, a switch 22 is arranged between the circuit just described and IF amplifier 3. The switch includes first and second fixed contact positions 24 and 25 and a contact arm 26 movable between contact positions 24 and 25 to select the desired sensitivity by controlling the voltage level applied to the IF amplifier 3. When the arm 26 of switch 22 is positioned in engagement with contact position 24, a bias voltage at one level is applied to the IF amplifier 3 through the terminal 19. When the arm 26 is positioned in engagement with contact position 25, the IF amplifier is connected through terminal 20 and switch 11 to the receiver reference potential point, typically at ground. Zero sensitivity control voltage is thus supplied to the IF amplifier 3.

OPERATION

When a scan is to be initiated, momentary contact switch 11 is actuated, for example, by a manual operation of the switch. Its contact arm 12 is moved from first contact position 13 to second momentary contact position 14, charging control capacitor 21 in the direction shown in the FIGURE from biasing source B+ through biasing resistor 18. Current also flows through resistors 16 and 17 and a positive voltage is supplied to contacts 24 and 25 of switch 22. The voltage is coupled to the IF amplifier when contact arm 26 is in either of its positions to drive the amplifier to saturation and remove the input signal from the scan circuitry. The tuning circuitry consequently disengages from the station that was previously locked in. When the contact arm 26 of sensitivity control switch 22 is on contact position 25, the saturating positive voltage is applied to the IF amplifier 3 on the path from terminal 20 through contact arm 26. Should the contact arm 26 of the sensitivity control switch 22 be on contact position 24, the path supplying a reduced positive voltage but still sufficient to drive the amplifier into saturation, will be from terminal 19 through contact arm 26 to IF amplifier 3. As soon as the intermediate frequency signal is removed from the automatic frequency scan circuitry 7, a new scan is commenced.

Contact arm 12 of switch 11 need be engaged at contact position 14 only long enough for capacitor 21 to become charged and a positive saturating potential applied to IF amplifier 3. Upon contact arm 12 returning from its second contact position 14 to its first and normal contact position 13, the previously charged control capacitor 21 beings to discharge through resistors 16 and 17. Immediately upon contact arm 12 being returned to contact position 13, a negative voltage for reducing the sensitivity of the IF amplifier is impressed across the voltage divider 15. With the sensitivity control switch 22 having its contact arm 26 on first contact position 25, the sensitivity of the amplifier 3 will be maximum. In this position, zero voltage is supplied to the intermediate frequency amplifier 3 since terminal 20 is connected through switch 11 to the reference ground potential. With contact arm 26 of sensitivity control switch 22 on second contact position 24, a negative voltage temporarily present at terminal 19 is applied to IF amplifier 3. In this position there is a reduction in sensitivity of the amplifier 3, permitting only stations having high signal strengths to be received. After a period of time has elapsed, adequate to permit scanning of a given frequency band, control capacitor 21 will discharge completely through resistors 16 and 17 to remove the negative signal from the intermediate amplifier 3 and restore full sensitivity to the receiver.

It may be appreciated that numerous modifications may be made to the disclosed circuit without exceeding the basic invention. For example, although only two levels of sensitivity are included in the present embodiment, there may be three or more such levels provided by having additional taps on the potentiometer 15 and additional corresponding contacts for the switch 22.

What is new and novel and desired to be secured by Letters Patent of the United States is:

1. In a radio receiver employing automatic frequency scan circuitry for scanning through a frequency spectrum and stopping its scan in response to and for reception of a received signal of selected signal strength, a circuit comprising:
   a. means for applying a disabling voltage to a point within said receiver for removing said received signal from said automatic frequency scan circuitry, thereby permitting a scan to commence,
   b. means for selectively applying an enabling voltage of a first or second level to said point within said receiver during scanning of said frequency spectrum, the first voltage level causing said received signal to be processed through said receiver at a high sensitivity for stopping the scan in response to both weak and strong signals, the second voltage level causing said received signal to be processed through said receiver at a reduced sensitivity for stopping the scan in response to strong signals only, and c. means for restoring said receiver to high sensitivity after stopping of the scan where said second voltage level has been applied to said receiver.

2. A circuit as in claim 1 which includes a storage device coupled across a tapped impedance, a first switching device for selectively energizing said storage device and a second switching device for coupling said disabling and enabling voltages from said impedance to said receiver.

3. A circuit as in claim 2 wherein said second switching device couples said disabling and enabling voltages to an amplifier within said receiver for saturating said amplifier in response to said disabling voltage and for controlling the sensitivity of said amplifier in response to said enabling voltage.

4. In a radio receiver employing automatic frequency scan circuitry for scanning through a frequency spectrum and stopping its scan in response to and for reception of a received signal of selected signal strength, a circuit comprising:
   a. a storage device,
   b. a tapped impedance coupled across said storage device,
   c. a first switching device having first contact means for charging said storage device so as to apply a first voltage characteristic across said impedance,
   d. said first switching device having second contact means for applying a second voltage characteristic across said impedance and for permitting said device to discharge through said impedance, said storage device being discharged over the duration of a single scan so as to correspondingly reduce the magnitude of the voltage across said impedance,
   e. a second switching device having first contact means for coupling a terminal on said impedance to a point within said radio receiver for disabling said receiver and permitting a first scan to commence when said first voltage characteristic is applied across said impedance, and for enabling said receiver at a high sensitivity for stopping the first scan in response to both weak and strong signals when said second voltage characteristic is applied across said impedance,
   f. said second switching device having second contact means coupling a further terminal on said impedance to said point within said radio receiver for disabling said receiver and permitting a second scan to commence when said first voltage characteristic is applied across said impedance and for enabling said receiver at a reduced sensitivity for stopping the second scan in response to strong signals only when said second voltage characteristic is applied across said impedance, the high sensitivity of said receiver being restored after the completion of said second scan.

5. In a radio receiver employing automatic frequency scan circuitry for scanning through a frequency spectrum and stopping its scan in response to and for reception of a received signal of selected signal strength, a circuit comprising:
   a. a control capacitor,
   b. a tapped resistance connected in parallel with said control capacitor between a pair of end terminals,
   c. a voltage source connected to one of said end terminals,
   d. a first switching device for selectively connecting said end terminals to a reference voltage point, said capacitor becoming charged by said voltage source when the other of said end terminals is connected to said reference voltage point and being permitted to discharge through said resistance when said one end terminal is connected to said reference voltage point, said capacitor being discharged after the duration of a single scan,
   e. a second switching device for selectively connecting first and second tap terminals on said tapped resistance to a point within said radio receiver, the selective connection of said first tap terminal applying a disabling voltage within said receiver for permitting a first scan to commence when said other end terminal is connected to said reference voltage point, and applying an enabling voltage that produces a high receiver sensitivity for stopping the first scan in response to both weak and strong signals when said one end terminal is connected to said reference voltage point, the selective connection of said second tap terminal applying a disabling voltage within said receiver for permitting a second scan to commence when said other end terminal is connected to said reference voltage point, and applying an enabling voltage that produces a reduced receiver sensitivity for stopping the second scan in response to strong signals only when said one end terminal is connected to said reference voltage point, high receiver sensitivity being restored after the completion of said second scan.

6. A circuit as in claim 5 wherein said second switching device couples said disabling and enabling voltages to an amplifier within said receiver for saturating said amplifier in response to said disabling voltage and for controlling the sensitivity of said amplifier in response to said enabling voltage.

7. A circuit as in claim 6 wherein said first tap terminal is joined to said one end terminal and said second terminal tap is at an intermediate point on said resistance between said pair of end terminals.

8. A circuit as in claim 7 wherein said voltage source is of positive potential and said reference voltage point is at ground.

* * * * *